United States Patent
Ben Simon et al.

(10) Patent No.: US 12,050,483 B2
(45) Date of Patent: Jul. 30, 2024

(54) DEVICE, SYSTEM AND METHOD TO DETECT CLOCK SKEW

(71) Applicant: Intel Corporation, Santa Clara, CA (US)

(72) Inventors: Yossi Ben Simon, Karmiel (IL); Ariel Avital, Kiryat Bialik (IL); Arkady Vaisman, Kiryat Ata (IL); Ernest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 805 days.

(21) Appl. No.: 17/021,900

(22) Filed: Sep. 15, 2020

(65) Prior Publication Data

US 2022/0083093 A1 Mar. 17, 2022

(51) Int. Cl.
| | |
|---|---|
| *G06F 1/04* | (2006.01) |
| *G06F 1/10* | (2006.01) |
| *H03K 19/173* | (2006.01) |
| *H03K 19/20* | (2006.01) |

(52) U.S. Cl.
CPC ........... *G06F 1/10* (2013.01); *H03K 19/1737* (2013.01); *H03K 19/20* (2013.01)

(58) Field of Classification Search
CPC ..... G06F 1/04; G06F 1/06; G06F 1/08; G06F 1/10; G06F 1/12; H03K 19/173; H03K 19/1733; H03K 19/1737; H03K 19/20
See application file for complete search history.

(56) References Cited

U.S. PATENT DOCUMENTS

| | | | |
|---|---|---|---|
| 5,436,908 A * | 7/1995 | Fluker | G06F 11/24 714/700 |
| 6,791,363 B1 * | 9/2004 | Amatangelo | G06F 9/3869 365/233.5 |

* cited by examiner

*Primary Examiner* — Long Nguyen
(74) *Attorney, Agent, or Firm* — NICHOLSON DE VOS WEBSTER & ELLIOTT LLP

(57) ABSTRACT

Techniques and mechanisms for determining an amount of skew between two clock signals. In an embodiment, detector circuitry receives a first signal and a signal which indicate (respectively) a NAND combination of clock signals, and a NOR combination of the clock signals. The detector circuitry evaluates a first length of time that the first signal indicates a respective first logic state, and a second length of time that the second signal indicates a respective second logic state. The skew is calculated based on a difference between the first length of time and the second length of time. In another embodiment, one of the first signal or the second signal is generated with a combinatorial logic gate, a transistor of which is relatively large, as compared to another transistor which is to operate based on one of the first signal, the second signal, or the clock signals.

20 Claims, 7 Drawing Sheets

DEVICE, SYSTEM AND METHOD TO DETECT CLOCK SKEW

BACKGROUND

1. Technical Field

This disclosure generally relates to clock signals and more particularly, but not exclusively, to the detection of a skew between two clock signals.

2. Background Art

Integrated circuit chips typically include a large number of circuit components that perform various logical functions, such as mathematical operations. Within such a chip, a clock signal, also known as a "global" clock signal, is used to synchronize data operations performed by circuit components positioned at different locations on the chip. For example, a circuit component at one location may indicate that information will be available in an internal register during the next global clock cycle. By operating based on the same global clock signal, a circuit component at another location may read the information from the register at the appropriate time. With successive generations of integrated circuit technologies, the frequencies of global clock signals have increased. Clock signals operating in the 3 gigahertz (GHz) to 5 GHz frequency range are now common, and will likely increase in the future.

The performance of integrated circuitry is based, at least in part, on the synchronization of the global clock signal (and/or one or more clock signals which are based on the global clock signal) throughout the chip. For example, it is desirable that information stored in a register is not read before the information has been correctly updated. Moreover, waiting too long before reading the information will usually slow down operations. Thus, it is desirable to have clock signals arrive at different locations, or destinations, as close to simultaneously as possible.

With the increase in global clock frequency, however, clock inaccuracy has become a large problem in integrated circuit design. A "skew" between two clock signals occurs when "edges" (logic state transitions) of the clock signals arrive at respective sampling points at different times. Clock skew is caused, for example, by differences between the lengths of clock signal paths, between clock driver circuitry, between stray capacitance characteristics, or the like.

As integrated circuit technologies continue to scale, the sensitivity of these technologies to clock skew is expected to increase. As a result, an increasing premium is being placed on solutions to detect a skew between clock signals.

BRIEF DESCRIPTION OF THE DRAWINGS

The various embodiments of the present invention are illustrated by way of example, and not by way of limitation, in the FIGURES of the accompanying drawings and in which.

DETAILED DESCRIPTION

Figure 1A:
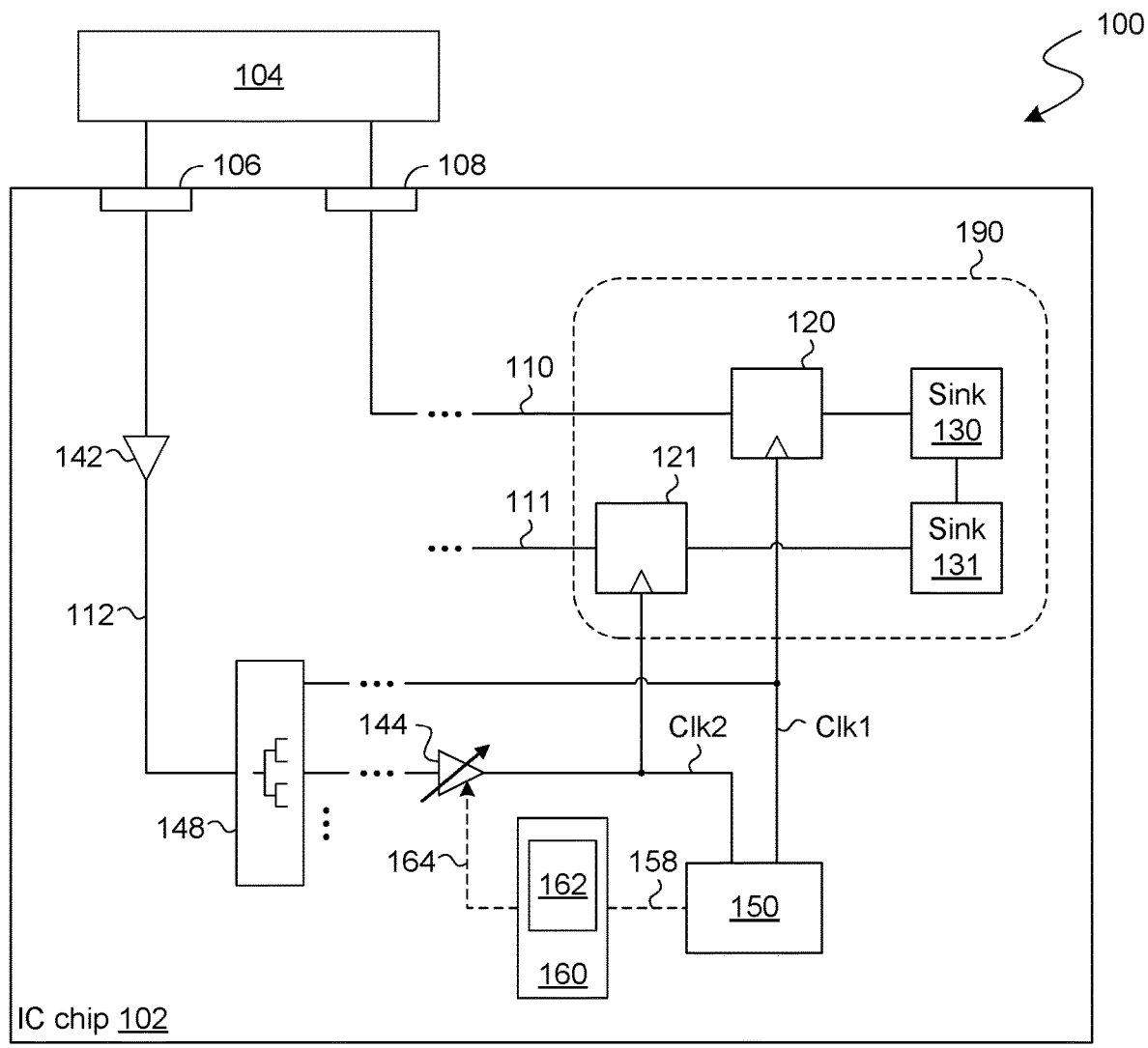
FIGS. 1A, 1B illustrate functional block diagrams each showing features of a system to detect clock skew according to an embodiment.

Embodiments discussed herein variously provide techniques and mechanisms for determining an amount of skew between two clock signals. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry to evaluate respective characteristics of two clock signals.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Various embodiments are described herein with respect to the evaluating of clock skew based on a first signal and a second signal which each indicate a different respective Boolean combination of two clock signals. In one such embodiment, the first signal indicates a NAND combination of two clock signals—e.g., where the first signal is equal to the NAND combination (or alternatively, is equal to or otherwise based on an AND combination) of two clock signals. Furthermore, the second signal indicates a NOR combination of two clock signals—e.g., where the first signal is equal to the NOR combination (or alternatively, is equal to or otherwise based on an OR combination) of two clock signals.

In various embodiments, clock skew is evaluated based on both a first length of time that the first signal indicates a respective first logic state, and a second length of time that the second signal indicates a respective second logic state (such as the first logic state). For example, the clock skew is evaluated, in one such embodiment, based on a difference between the first length of time and the second length of time.

Some embodiments generate one of the first signal or the second signal with a combinatorial logic gate (for example, including one a NAND gate, an AND gate, a NOR gate, or an OR gate), a transistor of which is relatively large—e.g., as compared to a transistor which operates based on an output of the combinatorial logic gate and/or as compared to a transistor which operates based on one of the clock signals. In this particular context, the size of a given transistor is defined, for example, with respect to a transistor dimension such as the length of a channel of said transistor. Using such large transistors in the combinatorial logic gates mitigates jitter and/or other performance characteristics that, for example, introduce distortion in the evaluation of clock skew.

By way of illustration and not limitation, some embodiments generate one of the first signal or the second signal with a combinatorial logic gate—e.g., a NAND gate or a NOR gate—which comprises a first transistor (such as a FinFET or any of various other suitable transistor devices). A second transistor is coupled to receive, or otherwise operate based on, one of the clock signals and/or an output of the combinatorial logic gate. In various embodiments, a first channel of the first transistor and a second channel of the second transistor have, respectively, a first length and a second length—e.g., wherein the first length is at least 50% greater than the second length. In one such embodiment, the first length is at least 100% greater than the second length.

FIG. 1A shows features of a system 100 to detect (and, in some embodiments, provide compensation for) a clock skew according to an embodiment. System 100 is one example of an embodiment wherein integrated circuitry is operable to evaluate an amount of skew between two clock signals which are variously communicated to facilitate synchronization of operations by respective circuit resources. Some or all of the skew is caused, for example, by differences between respective interconnects and/or other circuit structures by which the clock signals are variously communicated. In some embodiments, the clock signals are each based on (e.g., are different versions of) a common "global" clock signal—e.g., wherein the frequency of one such clock signal is an integer multiple of a frequency of the other clock signal.

As shown in FIG. 1A, system 100 comprises an integrated circuit (IC) chip 102 and a source 104 coupled thereto. Source 104 represents any of a variety of circuit devices to communicate a global clock signal with IC chip 102. For example, source 104 is another IC chip of a packaged device which also includes IC chip 102. Alternatively, a packaged device comprising IC chip 102 is coupled to another packaged device which includes source 104. In the example embodiment shown, a hardware interface of IC chip 102 comprises a conductive contact 106 (such as a microbump) to communicate a clock signal 112 with source 104—e.g., wherein clock signal 112 is communicated via receiver circuitry such as the illustrative amplifier 142 shown. In some embodiments, system 100 omits source 104 and, for example, comprises merely some (or all) circuitry of IC chip 102.

Latch circuitry 120 of IC chip 102 is coupled to receive a data signal 110 which, for example, source 104 communicates to IC chip 102 via a conductive contact 108. Data of data signal 110 is to be provided to some circuit resource of IC chip 102, such as the illustrative data sink 130 shown. Data sink 130 comprises a bus, a processor, a memory, a controller hub and/or any of various other circuit components which are operable to store, communicate or otherwise process some or all data of data signal 110. Some embodiments are not limited to a particular functionality that data sink 130 is to provide with such data.

In one such embodiment, other latch circuitry 121 of IC chip 102 is coupled to receive another data signal 111 (e.g., from source 104 or other circuitry). Data of data signal 111 is to be provided to some other circuit resource of IC chip 102, such as the illustrative data sink 131 shown. Some embodiments are not limited to a particular functionality that data sink 131 is to provide with such data.

To facilitate operation of IC chip 102, latch circuitry 120 and latch circuitry 121 facilitate a coordination of at least some synchronous domain 190 which comprises data sinks 130, 131. For example, a clock signal Clk1 controls latching by latch circuitry 120, wherein another clock signal Clk2 controls latching by latch circuitry 121. In the example embodiment shown, clock signals Clk1, Clk2 are variously generated based on (e.g., are different versions of) clock signal 112. By way of illustration and not limitation, versions of clock signal 112 (and/or clock signals otherwise based on clock signal 112) are variously communicated via clock signal distribution paths 148 of a clock signal distribution network. In some embodiments, some or all such clock signals are variously communicated each to respective circuitry (not shown) which comprises, for example, one or more of a frequency multiplier circuit, a frequency divider circuit, a duty cycle control circuit and/or the like.

In some embodiments, IC chip 102 comprises circuitry (such as the illustrative detector circuitry 150 shown) which is operable to detect a skew between two clock signals. Although some embodiments are not limited in this regard, IC chip 102 further comprises other circuitry (e.g., including the illustrative programmable delay line 144 shown) which is operable to mitigate said skew. For example, programmable delay line 144 is coupled to generate clock signal Clk2 by selectively applying a delay to a clock signal which is received from one of the clock signal distribution paths 148. In other embodiments, IC chip 102 omits delay line 144—e.g., wherein other circuitry of IC chip 102 is operable to otherwise compensate for a skew between clock signals Clk1, Clk2.

Figure 1B:
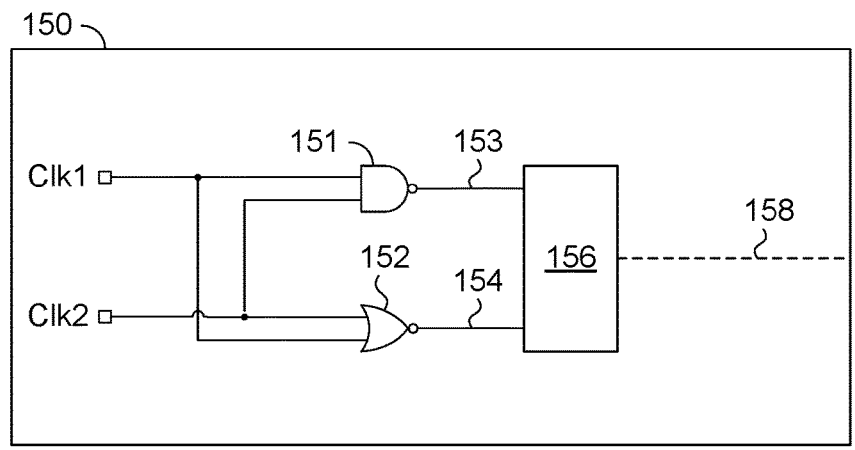

FIG. 1B shows a detail view of one implementation of detector circuitry 150 according to an embodiment. As shown in FIG. 1B, detector circuitry 150 comprises a NAND gate 151 and a NOR gate 152 which are each coupled to receive clock signals Clk1, Clk2. During operation of detector circuitry 150, NAND gate 151 generates a signal 153 which indicates a logical NAND combination of clock signals Clk1, Clk2. By contrast, NOR gate 152 generates another signal 154 which indicates a logical NOR combination of clock signals Clk1, Clk2.

Evaluation logic 156 of detector circuitry 150 is coupled to receive signals 153, 154 from NAND gate 151 and NOR gate 152 (respectively). Evaluation logic 156 comprises circuitry to determine, based on signals 153, 154, an amount of skew (if any) between clock signals Clk1, Clk2. For example, evaluation logic 156 evaluates a first duration (Ts1) of a period of time that signal 153 indicates a first logic state (e.g., a particular one of a Boolean "True" state or a Boolean "False" state). In one such embodiment, evaluation logic 156 further evaluates a second duration (Ts2) of a period of time that signal 154 indicates a second logic state which, for example, is the first logic state (or alternatively, a different one of the "True" state or the "False" state). Based on the first duration (Ts1) and the second duration (Ts2), evaluation logic 156 generates a signal 158 which specifies or otherwise indicates a skew (Tsk) between clock signals Clk1, Clk2—e.g., where signal 158 is based on a difference between the first duration (Ts1) and the second duration (Ts2).

Based on signal 158, an encoder 160 which is coupled to detector circuitry 150 generates a control signal 164 which (for example) is used to operate delay line 144 for applying a corresponding delay to clock signal Clk2. By way of illustration and not limitation, encoder 160 includes, has access to, or otherwise operates based on some predetermined configuration state (e.g., including the illustrative reference information 162 shown) which specifies or otherwise indicates a correspondence of various amounts of skew each to a different respective voltage, frequency, and/or other characteristic of control signal 164. Encoder 160 is initialized, preprogrammed or otherwise preconfigured with such configuration state by a manufacturer or other such agent—e.g., after one of a fabrication, packaging, assembly or other stage. Using reference information 162 (or other suitable configuration state), encoder 160 performs an encoding, lookup and/or other operation based on signal 158 to determine how control signal 164 is to indicate a particular delay to be applied with delay line 144. In an alternative embodiment, IC chip 102 omits encoder 160—e.g., wherein signal 158 is provided directly to control delay line 144.

In various other embodiments, detector circuitry 150 does not operate with circuitry that is to mitigate a skew between two clock signals—e.g., wherein IC chip 102 instead omits delay line 144. By way of illustration and not limitation, in some embodiments, signal 158 is instead provided to circuitry (which resides on or, alternatively, is coupled to IC chip 102) that is to determine, based on the identified clock skew, whether IC chip 102 fails to satisfy some predefined performance criteria. Alternatively or in addition, in some embodiments, detector circuitry 150 communicates signal 158 to a circuit resource which compensates for (but do not actually mitigate) the identified skew between clock signals Clk1, Clk2.

In some embodiments, evaluation logic 156 is further coupled to directly receive clock signals Clk1, Clk2. In one such embodiment, generation of signal 158 is further based on evaluation logic 156 evaluating both a duration Tc1 of a period of time that clock signal Clk1 indicates a first one of a high output state or a low output state and a duration Tc2 of a period of time that clock signal Clk2 indicates the first one of the high output state or the low output state. Alternatively or in addition, evaluation logic 156 determines a given time duration—e.g., one of durations Ts1, Ts2, Tc1, Tc2—based on only one cycle of a corresponding signal (or alternatively, based on a statistical evaluation of multiple cycles of the corresponding signal). In some embodiments, evaluation logic 156 evaluates two or more durations—e.g., including multiple ones of durations Ts1, Ts2, Tc1, Tc2—in parallel with each other. In an alternative embodiment, evaluation logic 156 comprises circuitry to multiplex between communicating one of clock signal Clk1, clock signal Clk2, signal 153, or signal 154 (for the evaluation thereof) and the communicating of another of clock signal Clk1, clock signal Clk2, signal 153, or signal 154.

In the example embodiment of system 100, clock signals Clk1, Clk2 are provided to control operations of latch circuitry 120, 121 for latching data to data sinks 130, 131. However, other embodiments variously facilitate additional or alternate uses of two (or more) clock signals. For example, some embodiments are not limited to a particular source from which a clock signal is received, to a particular path by which the given clock signal is communicated to detector circuitry 150 (and/or to a sink of synchronous domain 190), and/or to a particular circuit resource of synchronous domain 190 that is to operate based on a given one or more clock signals. Furthermore, some embodiments are not limited to a particular mechanism by which a clock signal is to be delayed or otherwise adjusted based on the skew which is detected with detector circuitry 150. For example, delay line 144 comprises circuitry adapted from any of various conventional programmable delay line designs, in various embodiments.

Furthermore, some embodiments do not comprise (and in certain more particular embodiments, otherwise operate with) circuitry to mitigate a skew between two clock signals. By way of illustration and not limitation, some embodiments identify an amount of clock skew merely for determining—e.g., during quality assurance operations of manufacturing—that a chip is out-of-range according to some predefined performance criteria. Alternatively or in addition, some embodiments identify an amount of clock skew to facilitate operation of one or more mechanisms which otherwise compensate for (but do not actually mitigate) said clock skew—e.g., where such operations are adapted from any of various conventional skew compensation techniques.

Figure 2:
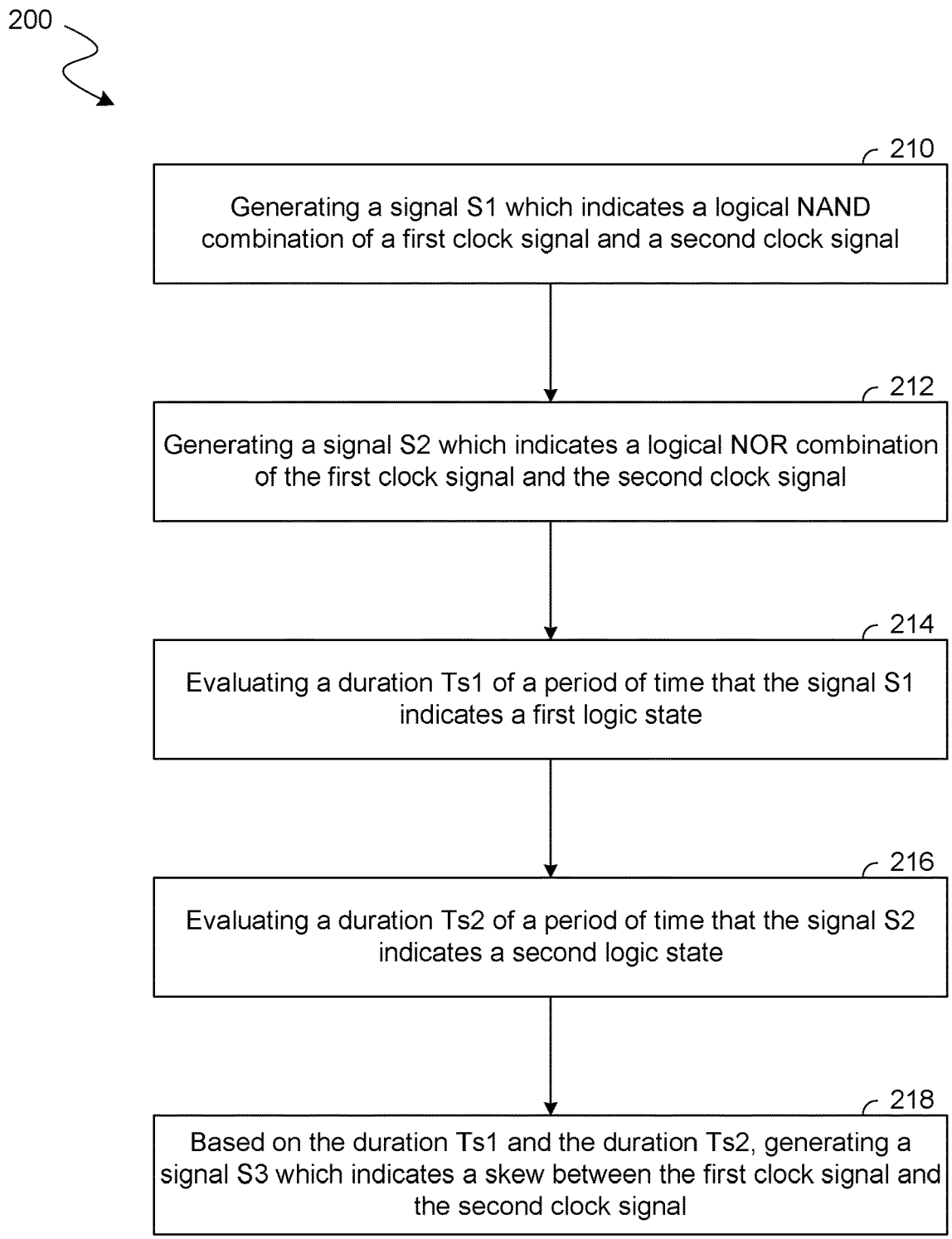
FIG. 2 illustrates a flow diagram showing features of a method to determine a skew between clock signals according to an embodiment.

FIG. 2 shows features of a method 200 to evaluate clock skew according to an embodiment. Method 200 is one example of an embodiment wherein an amount of clock skew is determined based on signals which indicate (respectively) a NAND combination of two clock signals, and a NOR combination of the two clock signals. In various embodiments, detector circuitry 150 (for example) provides functionality to perform some or all of method 200—e.g., wherein one or more operations of method 200 are performed with detector circuitry 150.

As shown in FIG. 2, method 200 includes (at 210) generating a signal S1—e.g., such as signal 153—which indicates a logical NAND combination of a first clock signal and a second clock signal. In some embodiments, the first and second clock signals are each based on a common clock such as clock signal 112—e.g., wherein a frequency of the first clock signal is equal to (or some other integer multiple of) a frequency of the second clock signal. In one such embodiment, a duty cycle of the first clock signal is equal to a duty cycle of the second clock signal.

Method 200 further comprises (at 212) generating a signal S2—e.g., such as signal 154—which indicates a logical NOR combination of the first clock signal and the second clock signal. Based on the signals S1, S2, method 200 evaluates a skew between the first and second clock signals. For example, method 200 further comprises (at 214) evaluating a duration Ts1 of a period of time that signal S1 indicates a first logic state—e.g., a particular one of a Boolean "True" state or a Boolean "False" state.

Method 200 further comprises (at 216) evaluating a duration Ts2 of a period of time that signal S2 indicates a second logic state—e.g., the first logic state or, alternatively, another one of a Boolean "True" state or a Boolean "False" state. In an embodiment, one of the duration Ts1 or the duration Ts2 is evaluated statistically (e.g., as an average value) based on each of multiple cycles of one of signal S1 or signal S2. Alternatively or in addition, evaluating the duration Ts1 at 214 is performed in parallel with evaluating the duration Ts2 at 216, in some embodiments.

Method 200 further comprises (at 218) generating a signal S3, based on the duration Ts1 and the duration Ts2, which indicates a skew between the first clock signal and the second clock signal. In one such embodiment, signal S3 (such as the signal 158) is generated at 218 based on a difference between the duration Ts1 and the duration Ts2—e.g., according to the equation (2) described herein.

In some embodiments, the generating at 218 is further based on operations (not shown) which evaluate one or more other characteristics of the first clock signal and/or the second clock signal. In one such embodiment, said operations comprise evaluating a duration Tc1 of a period of time that the first clock signal indicates a first one of a high output state or a low output state. Such operations further comprise evaluating a duration Tc2 of a period of time that the second clock signal indicates the first one of the high output state or the low output state, wherein signal S3 is generated at 218 based on each of the durations Ts1, Ts2, Tc1, Tc2—e.g. according to the equation (1) described herein. In some embodiments, the generating at 218 includes or is otherwise facilitated by method 200 multiplexing between a first communication of one of the first clock signal, the second clock signal, signal S1, or signal S2, and a second communication of a different one of the first clock signal, the second clock signal, signal S1, or signal S2.

In various embodiments, method 200 further comprises one or more operations (not shown) to mitigate clock skew based on the signal S3. For example, said one or more operations comprise applying a delay to one of the first clock signal or the second clock signal based on signal S3. In one such embodiment, the one or more operations comprise generating a signal S4 which identifies a leading one of the first clock signal or the second clock signal, wherein applying the delay is further based on signal S4.

Figure 3A:
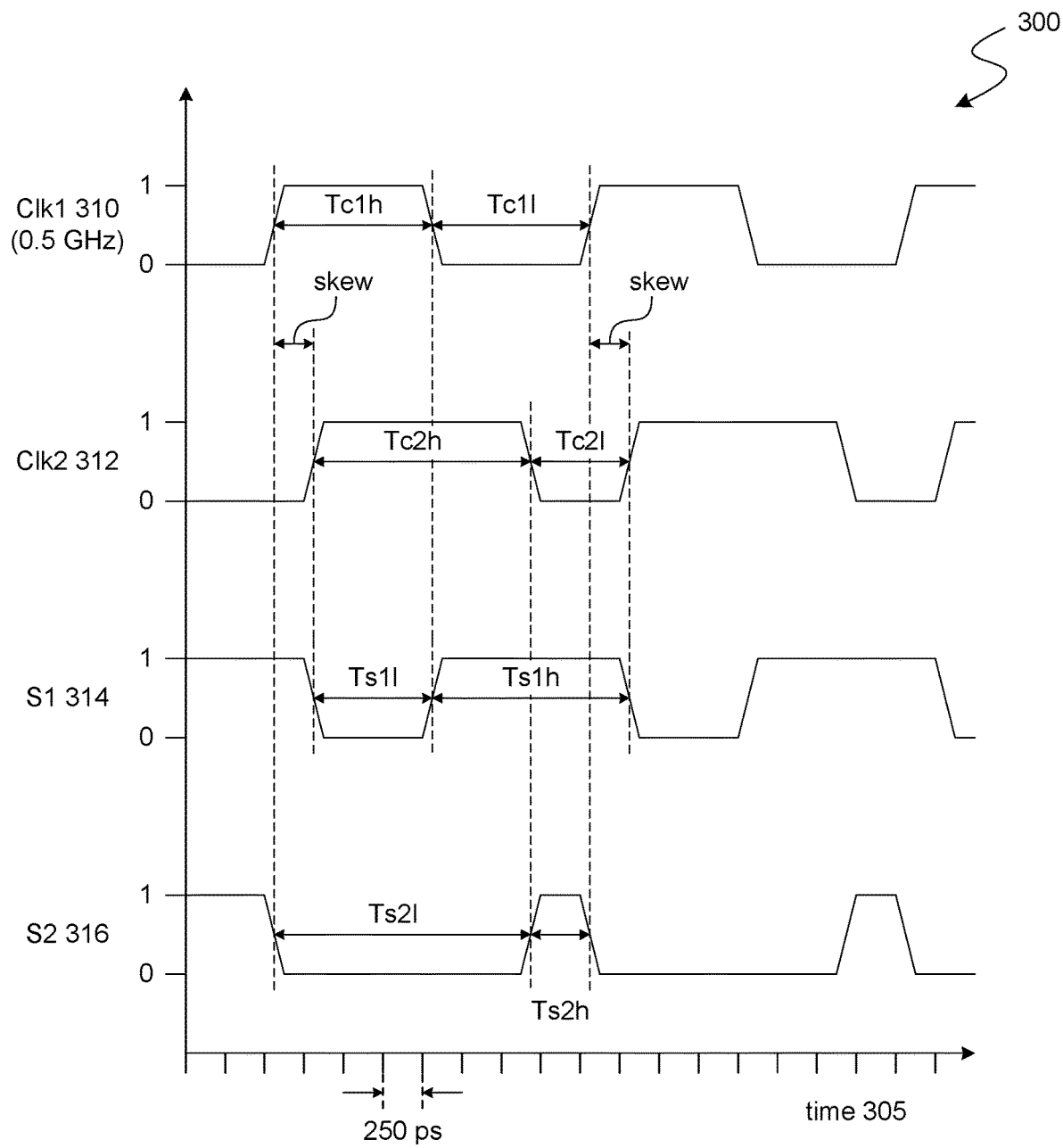
FIGS. 3A, 3B illustrate timing diagrams each showing features of respective signals generated to determine clock skew according to a corresponding embodiment.

FIG. 3A shows a timing diagram 300 which illustrates signals that variously provide a basis for determining a clock skew according to an embodiment. Such signals are generated by (and/or are a basis for) operations of method 200—e.g., where timing diagram 300 illustrates signals communicated with detector circuitry 150.

As shown in FIG. 3A, the signals in timing diagram 300, which are variously communicated over a range of time 305, include clock signals Clk1 310, Clk2 312 (such as the first and second clock signals described with reference to method 200). Timing diagram 300 shows a length of time Tc1h during which clock signal Clk1 310 is in a high output state, a length of time Tc1l during which clock signal Clk1 310 is in a low output state, a length of time Tc2h during which clock signal Clk2 312 is in a high output state, and a length of time Tc2l during which clock signal Clk2 312 is in a low output state.

In the example embodiment shown, clock signals Clk1 310, Clk2 312 each have a respective frequency of 0.5 GHz, wherein the respective duty cycles of clock signals Clk1 310, Clk2 312 are 50% and 68.75%. However, some embodiments are not limited to a particular frequency, and/or are not limited to a particular duty cycle, of one or both of clock signals Clk1 310, Clk2 312.

In various embodiments, circuitry (such as that of detector circuitry 150) generates a signal S1 314 which represents a NAND combination of clock signals Clk1 310, Clk2 312. Such detector circuitry further generates a signal S2 316 which represents a NOR combination of clock signals Clk1 310, Clk2 312. An evaluation of clock skew is performed (for example, by evaluation logic 156) based on signal S1 314, and signal S2 316.

By way of illustration and not limitation, timing diagram 300 further shows a length of time Ts1h during which signal S1 314 represents a logic "1" (True) state, a length of time Ts1l during which signal S1 314 represents a logic "0" (False) state, a length of time Ts2h during which signal S2 316 represents a logic "1" state, and a length of time Ts2l during which signal S2 316 represents a logic "0" state. As shown in timing diagram 300, a length of time (Tsk) of a skew between clock signals Clk1 310, Clk2 312 is calculated, for example, according to the following:

$$Tsk=[Ts1h-Ts2h+Tc1h-Tc2h]/2 \quad (1)$$

In one scenario, according to the illustrative embodiment shown, the lengths of time Tc1h, Tc2h, Ts1h, and Ts2h are equal to 1000 picoseconds (ps), 1375 ps, 1250 ps, and 375 ps (respectively). Accordingly, the length of time Tsk—as evaluated according to equation (1)—is 250 ps. In some embodiments, a control signal is generated to mitigate this 250 ps skew—e.g., by applying a delay to a leading one of clock signals Clk1 310, Clk2 312 (which, in this example, is clock signal Clk1 310). It is to be appreciated that the respective values of the lengths of time Tc1h, Tc2h, Ts1h, and Ts2h shown in FIG. 3A (and the respective frequencies and duty cycles of clock signals Clk1 310, Clk2 312) are merely illustrative of one embodiment, and are not limiting on other embodiments.

Figure 3B:
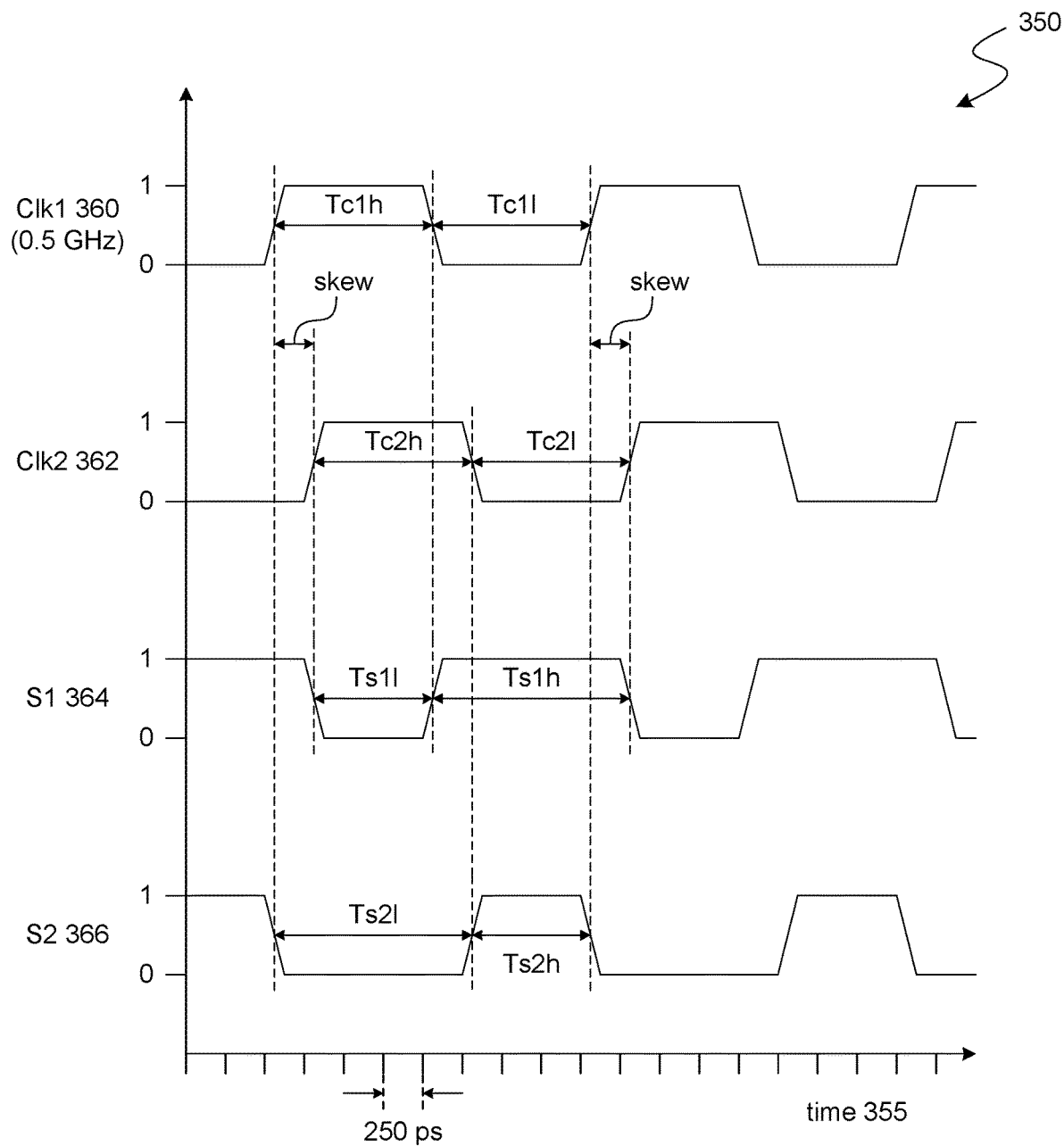

FIG. 3B shows a timing diagram 350 which illustrates other signals that provide a basis for evaluating clock skew according to an alternative embodiment. The signals in timing diagram 350, which are variously communicated over a range of time 355, include clock signals Clk1 360, Clk2 362, a signal S1 364 which represents a NAND combination of clock signals Clk1 360, Clk2 362, and a signal S2 366 which represents a NOR combination of clock signals Clk1 360, Clk2 362.

Timing diagram 350 shows a length of time Tc1h during which clock signal Clk1 360 is in a high output state, length of time Tc1l during which clock signal Clk1 360 is in a low output state, a length of time Tc2h during which clock signal Clk2 362 is in a high output state, and a length of time Tc2l during which clock signal Clk2 362 is in a low output state. Timing diagram 350 further shows a length of time Ts1h during which signal S1 364 represents a logic "1" (True) state, a length of time Ts1l during which signal S1 364 represents a logic "0" (False) state, a length of time Ts2h during which signal S2 366 represents a logic "1" state, and a length of time Ts2l during which signal S2 366 represents a logic "0" state.

In the illustrative embodiment shown, clock signals Clk1 360, Clk2 362 each have a respective frequency of 0.5 GHz, wherein clock signals Clk1 360, Clk2 362 each have the same duty cycle (in this example, 50%). In such a scenario—e.g., due to Tc1h being equal to Tc2h—a special case of equation (1) can be represented as follows:

$$Tsk=[Ts1h-Ts2h]/2 \quad (2)$$

In an example scenario according to the embodiment shown, the lengths of time Tc1h, Tc2h are each equal to 1000 ps, wherein the lengths of time Ts1h, and Ts2h are equal to 1250 ps, and 750 ps (respectively). Accordingly, the length of time Tsk—as evaluated according to equation (2)—is 250 ps.

A duty cycle monitor (DCM) in various embodiments comprises circuitry to evaluate length of time Ts1l and/or the length of time Ts1h based on a frequency of signal S1 314 (and/or to evaluate one or both of the lengths of time Ts2l, Ts2h based on a frequency of signal S2 316). By way of illustration and not limitation, such a DCM determines the frequency of signal S1 314 based on a known frequency of clock signal Clk1 310 (or alternatively, of clock signal Clk2 312), and on a detected ratio of cycles of signal S1 314, in a given period of time, to cycles of clock signal Clk 1 310 in that same period of time. In some embodiments, the DCM further comprises circuitry to repeatedly sample signal S1 314 to generate a first count of samples which each represent a first logic (Boolean) state, and a second count of samples which each represent a second logic (Boolean) state other than the first logic state. Based on a ratio of such a first count to the second count, and further based on the determined frequency of signal S1 314, the DCM statistically evaluates the length of time Ts1l and/or the length of time Ts1h. In one such embodiment, the same DCM—or alternatively, a different DCM—is coupled to similarly receive signal S2 316 and to statistically determine the length of time Ts2l and/or the length of time Ts2h. Some existing DCM circuits support the statistical evaluation of a length of time with a measurement error of +/−1 picosecond (ps). However, any of a variety of other DCM circuit types are adapted to detect one or more of the lengths of time Ts1l, Ts1h, Ts2l, Ts2h, in different embodiments.

Figure 4:
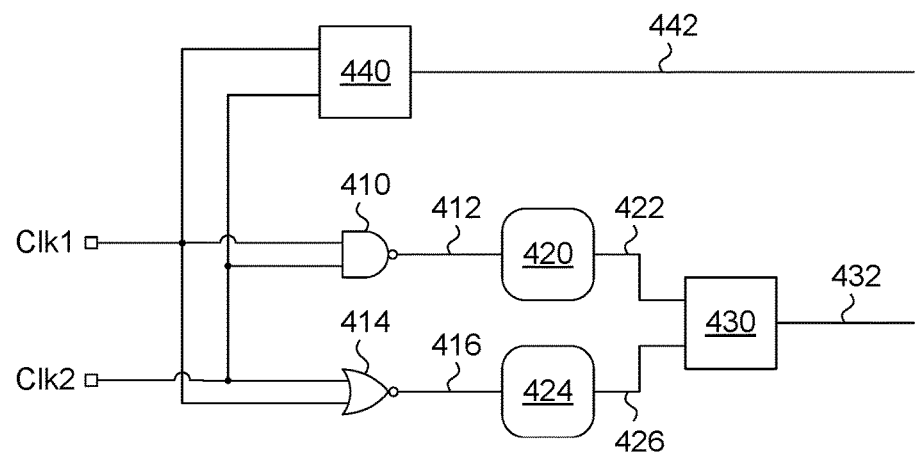
FIGS. 4-6 illustrate functional block diagrams each showing features of a respective circuit to determine a skew between clock signals according to a corresponding embodiment.

FIG. 4 shows features of detector circuitry 400 to determine an amount of skew between clock signals according to an embodiment. Detector circuitry 400 is one example of an embodiment wherein clock skew is identified based on signals (such as signals 153, 154) which are evaluated in parallel with each other—e.g., where such identifying is performed independent of any direct evaluation of a clock signal. In various embodiments, detector circuitry 400 provides functionality of detector circuitry 150—e.g., where detector circuitry 400 performs or otherwise facilitates some or all of method 200. Additionally or alternatively, detector circuitry 400 communicates signals such as those shown in one of timing diagrams 300, 350.

As shown in FIG. 4, detector circuitry 400 comprises a NAND gate 410 and a NOR gate 414 which are each coupled to receive clock signals Clk1, Clk2. During operation of detector circuitry 400, NAND gate 410 generates a signal 412 which indicates a logical NAND combination of clock signals Clk1, Clk2. By contrast, NOR gate 414 generates another signal 416 which indicates a logical NOR combination of clock signals Clk1, Clk2.

Evaluation logic 420 of detector circuitry 400 is coupled to receive signal 412, and to generate a signal 422 which identifies a first length of time that signal 412 indicates a first logic state. Similarly, evaluation logic 424 of detector circuitry 400 is coupled to receive signal 416, and to generate a signal 426 which identifies a second length of time that signal 416 indicates a second logic state (such as the first logic state or, alternatively, another one of a Boolean "True" state or a Boolean "False" state).

Calculation logic 430 of detector circuitry 400 is coupled to receive signals 422, 426—in parallel—from evaluation logic 420 and evaluation logic 424 (respectively). Based on the first length of time and the second length of time—as indicated by signals 422, 426—calculation logic 430 generates a signal 432 which identifies a duration (Tsk) of a skew between clock signals Clk1, Clk2. In one such embodiment, signal 432 (e.g., the signal S3 described herein with reference to method 200) is based on a difference between the first length of time and the second length of time. For example, generation of signal 432 comprises calculation logic 430 performing a calculation according to one of equations (1) or (2) described herein.

In some embodiments, detector circuitry 400 further comprises lead detection logic 440 which is coupled to receive clock signals Clk1, Clk2. Circuitry of lead detection logic 440 detects which of clock signals Clk1, Clk2 is leading the other of clock signals Clk1, Clk2—e.g., wherein a signal 442 from lead detection logic 440 identifies the leading clock signal. In one such embodiment, detector circuitry 400 further comprises, or is coupled to operate with, circuit logic (not shown) which applies a delay to one of clock signals Clk1, Clk2 based on signals 432, 442.

Figure 5:
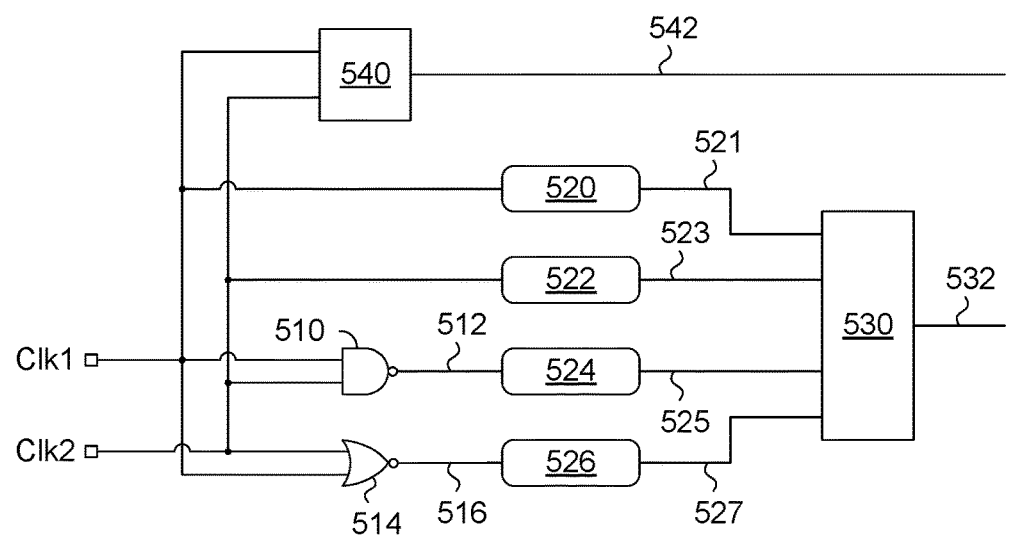

FIG. 5 shows features of detector circuitry 500 to determine an amount of skew between clock signals according to another embodiment. Detector circuitry 500 is one example of an embodiment wherein clock skew is identified based on signals which are evaluated in parallel with each other—e.g., where the signals include two clock signals and other signals representing various logical combinations of said clock signals. In various embodiments, detector circuitry 500 provides functionality of detector circuitry 150 or detector circuitry 400—e.g., where detector circuitry 500 performs or otherwise facilitates some or all of method 200. Additionally or alternatively, detector circuitry 500 communicates signals such as those shown in one of timing diagrams 300, 350.

As shown in FIG. 5, detector circuitry 500 comprises a NAND gate 510, NOR gate 514, evaluation logic 524, and evaluation logic 526 which—for example—correspond functionally to NAND gate 410, NOR gate 414, evaluation logic 420, and evaluation logic 424 (respectively). Furthermore, lead detection logic 540 of detector circuitry 500 corresponds functionally to lead detection logic 440, for example.

During operation of detector circuitry 500, NAND gate 510 generates a signal 512 which indicates a logical NAND combination of two clock signals Clk1, Clk2—e.g., wherein NOR gate 514 generates another signal 516 which indicates a logical NOR combination of the same clock signals Clk1, Clk2. Based on signal 512, evaluation logic 524 generates a signal 525 which identifies a first length of time that signal 512 indicates a first logic state. By contrast, evaluation logic 526 generates a signal 527 which identifies a second length of time that signal 516 indicates a second logic state (such as the first logic state or, alternatively, another one of a Boolean "True" state or a Boolean "False" state).

In some embodiments, detector circuitry 500 further comprises evaluation logic 520 and evaluation logic 522 which are coupled to receive clock signals Clk1, Clk2 (respectively). Evaluation logic 520 comprises circuitry to generate a signal 521 which identifies a third length of time that clock signal Clk1 is in a particular one of a high output state or a low output state. Similarly, circuitry of evaluation logic 522 generates a signal 523 which identifies a fourth length of time that clock signal Clk2 is in said one of the high output state or the low output state.

Calculation logic 530 of detector circuitry 500 is coupled to receive signals 521, 523, 525, 527—in parallel—from evaluation logic 520, evaluation logic 522, evaluation logic 524, and evaluation logic 526 (respectively). Based on the various lengths of time indicated by signals 521, 523, 525, 527, calculation logic 530 generates a signal 532 which identifies a duration (Tsk) of a skew between clock signals Clk1, Clk2. In one such embodiment, signal 532 (e.g., the signal S3 described herein with reference to method 200) is based on a difference between the first length of time and the second length of time—e.g., where the duration Tsk is calculated according to equation (1) described herein. In some embodiments, lead detection logic 540 is coupled to detects a leading one of clock signals Clk1, Clk2—e.g., wherein a signal 542 from lead detection logic 540 identifies the leading clock signal. In one such embodiment, detector circuitry 500 further comprises, or is coupled to operate with, circuit logic (not shown) which applies a delay to one of clock signals Clk1, Clk2 based on signals 532, 542.

Figure 6:
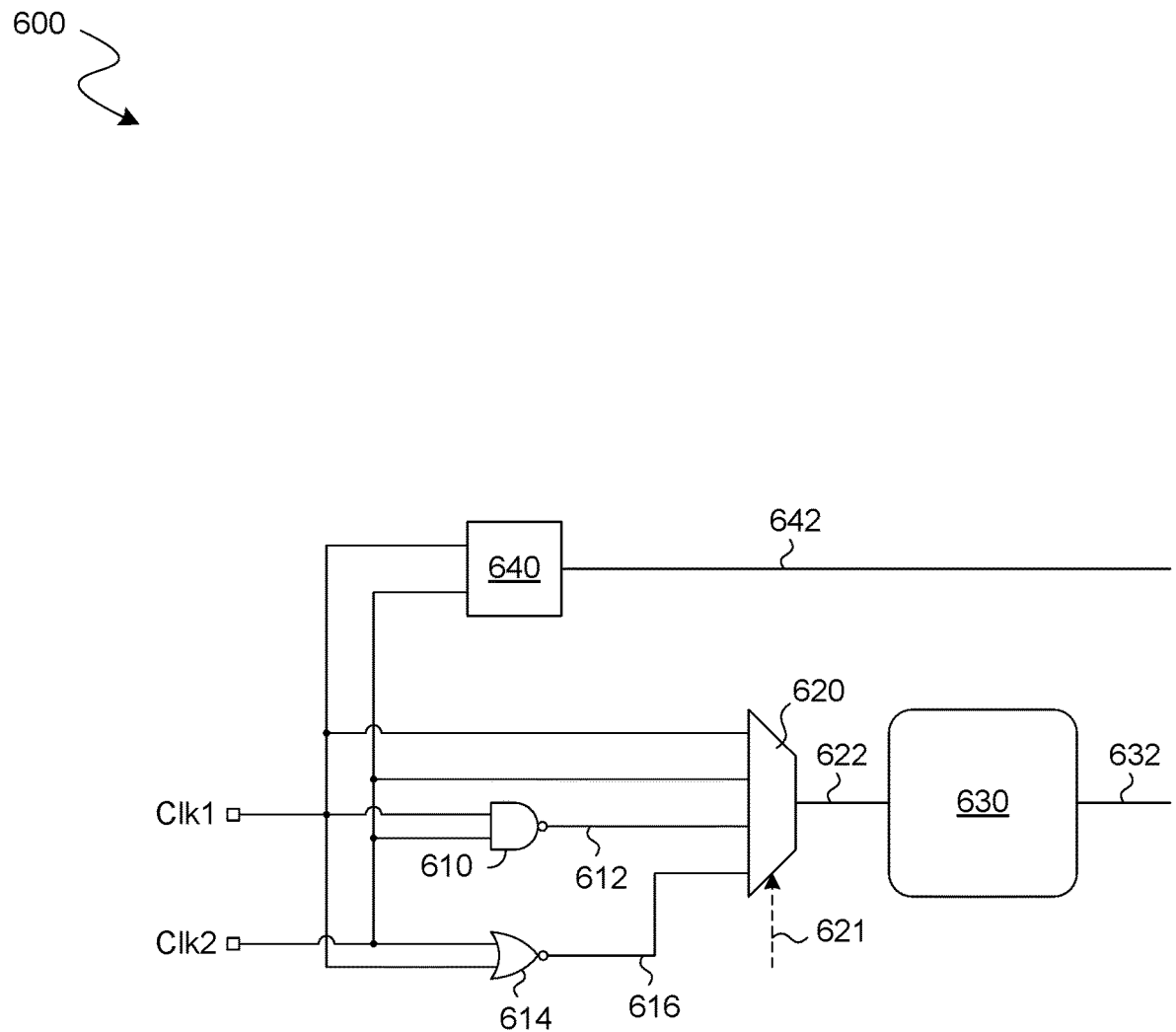

FIG. 6 shows features of detector circuitry 600 to determine clock skew according to another embodiment. Detector circuitry 600 is one example of an embodiment wherein multiplexer circuitry facilitates the sequential evaluation of various signals to identify an amount of skew between two clock signals. In various embodiments, detector circuitry 600 provides functionality of detector circuitry 150—e.g., where detector circuitry 600 facilitates some or all of method 200 and/or communicates signals such as those shown in one of timing diagrams 300, 350.

As shown in FIG. 6, detector circuitry 600 comprises a NAND gate 610, NOR gate 614, and lead detection logic 640 which—for example—correspond functionally to NAND gate 410, NOR gate 414, and lead detection logic 440. In one such embodiment, signals 612, 616, 642—which are variously generated with NAND gate 610, signal 612, and lead detection logic 640—correspond functionally to signals 412, 416, 442 (respectively). Switch circuitry of detector circuitry 600 (such as the illustrative multiplexer 620 shown) is coupled to receive each of signals 612, 616, and clock signals Clk1, Clk2—e.g., wherein, responsive to a control signal 621, multiplexer 620 sequentially multiplexes between communicating said signals as output 622. Generation of control signal 621 is performed, for example, with any of various types of control circuits (not shown) which are not limiting on various embodiments.

Detector circuitry 600 further comprises circuit logic (such as the illustrative evaluation logic 630 shown) which is coupled to sequentially receive clock signal Clk1, clock signal Clk2, signal 612, and signal 616 each as part of output 622. For signals 612, 616, and clock signals Clk1, Clk2, evaluation logic 630 sequentially performs evaluations each of a respective length of time during which a corresponding signal is in a particular one of a high state or a low state—e.g., wherein evaluation logic 630 provides functionality of evaluation logic 420 or evaluation logic 424. In some embodiments, evaluation logic 630 further provides functionality (such as that of calculation logic 430, for example) to calculate a duration of a skew between clock signals Clk1, Clk2—e.g., wherein such calculation is based on the various lengths of time that are evaluated for signals 612, 616, and clock signals Clk1, Clk2. In one such embodiment, the calculation is performed according to equation (1). In one such embodiment, detector circuitry 600 further comprises, or is coupled to operate with, circuit logic (not shown) which applies a delay to one of clock signals Clk1, Clk2 based on signal 642 and a signal 632—from evaluation logic 630—which identifies the calculated skew (e.g., where signal 632 is the signal S3 described herein with reference to method 200).

Figure 7:
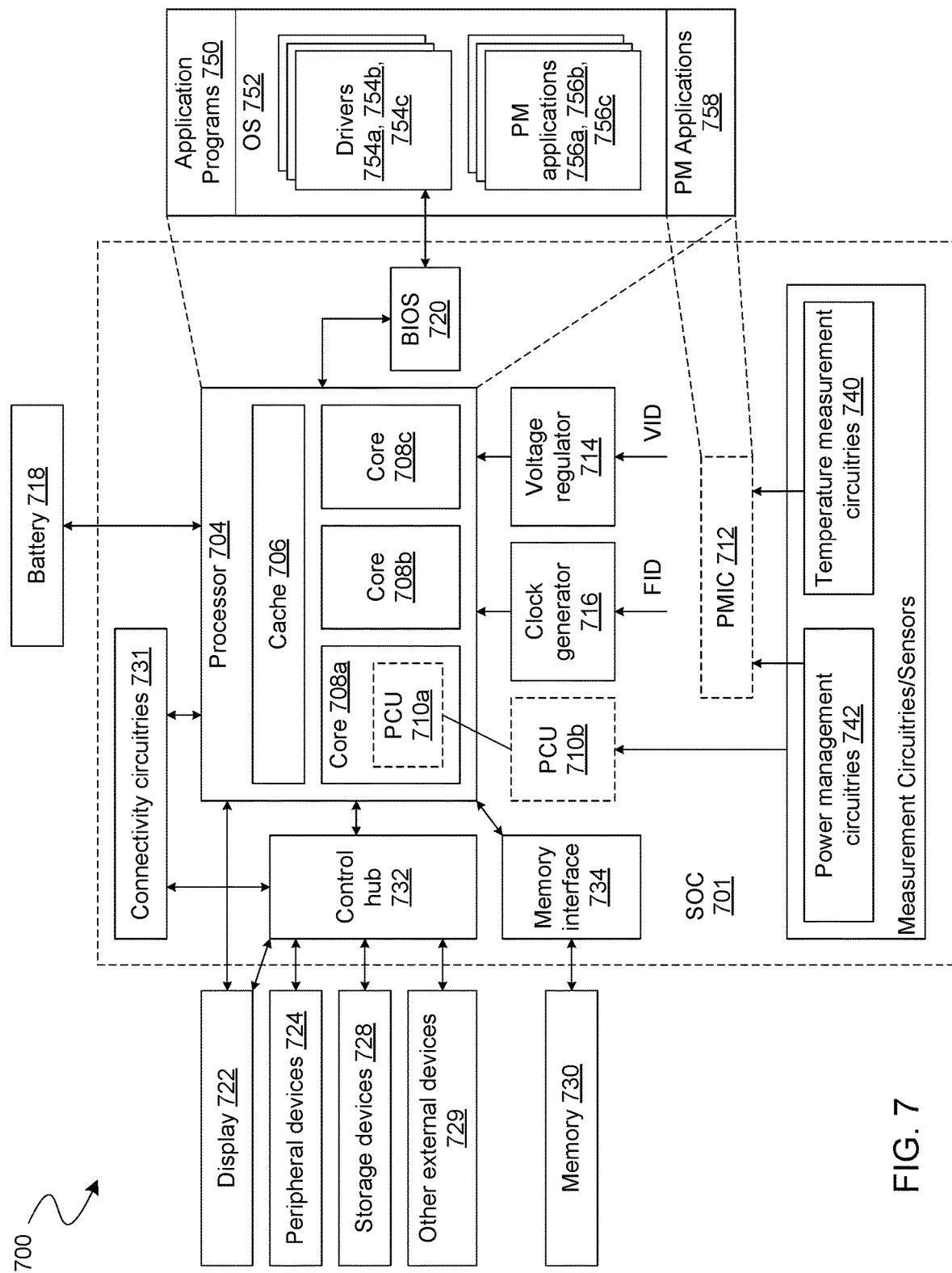
FIG. 7 illustrates a computer system to detect a clock skew according to an embodiment.

FIG. 7 illustrates a computer system or computing device 700 (also referred to as device 700), where a skew between clock signals is evaluated, in accordance with some embodiments. It is pointed out that those elements of FIG. 7 having the same reference numbers (or names) as the elements of any other figure can operate or function in any manner similar to that described, but are not limited to such.

In some embodiments, device 700 represents an appropriate computing device, such as a computing tablet, a mobile phone or smart-phone, a laptop, a desktop, an Internet-of-Things (TOT) device, a server, a wearable device, a set-top box, a wireless-enabled e-reader, or the like. It will be understood that certain components are shown generally, and not all components of such a device are shown in device 700.

In an example, the device 700 comprises a SoC (System-on-Chip) 701. An example boundary of the SOC 701 is illustrated using dotted lines in FIG. 7, with some example components being illustrated to be included within SOC 701—however, SOC 701 may include any appropriate components of device 700.

In some embodiments, device 700 includes processor 704. Processor 704 can include one or more physical devices, such as microprocessors, application processors, microcontrollers, programmable logic devices, processing cores, or other processing means. The processing operations performed by processor 704 include the execution of an operating platform or operating system on which applications and/or device functions are executed. The processing operations include operations related to I/O (input/output) with a human user or with other devices, operations related to power management, operations related to connecting computing device 700 to another device, and/or the like. The processing operations may also include operations related to audio I/O and/or display I/O.

In some embodiments, processor 704 includes multiple processing cores (also referred to as cores) 708a, 708b, 708c. Although merely three cores 708a, 708b, 708c are illustrated in FIG. 7, the processor 704 may include any other appropriate number of processing cores, e.g., tens, or even hundreds of processing cores. Processor cores 708a, 708b, 708c may be implemented on a single integrated circuit (IC) chip. Moreover, the chip may include one or more shared and/or private caches, buses or interconnections, graphics and/or memory controllers, or other components.

In some embodiments, processor 704 includes cache 706. In an example, sections of cache 706 may be dedicated to individual cores 708 (e.g., a first section of cache 706 dedicated to core 708a, a second section of cache 706 dedicated to core 708b, and so on). In an example, one or more sections of cache 706 may be shared among two or more of cores 708. Cache 706 may be split in different levels, e.g., level 1 (L1) cache, level 2 (L2) cache, level 3 (L3) cache, etc.

In some embodiments, processor 704 may include a fetch unit to fetch instructions (including instructions with conditional branches) for execution by the processor 704. The instructions may be fetched from any storage devices such as the memory 730. Processor 704 may also include a decode unit to decode the fetched instruction. For example, the decode unit may decode the fetched instruction into a plurality of micro-operations. Processor 704 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor 704 may be an out-of-order processor core in one embodiment. Processor 704 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor 704 may also include a bus unit to enable communication between components of the processor 704 and other components via one or more buses. Processor 704 may also include one or more registers to store data accessed by various components of processor 704 (such as values related to assigned app priorities and/or sub-system states (modes) association.

In some embodiments, device 700 comprises connectivity circuitries 731. For example, connectivity circuitries 731 includes hardware devices (e.g., wireless and/or wired connectors and communication hardware) and/or software components (e.g., drivers, protocol stacks), e.g., to enable device 700 to communicate with external devices. Device 700 may be separate from the external devices, such as other computing devices, wireless access points or base stations, etc.

In an example, connectivity circuitries 731 may include multiple different types of connectivity. To generalize, the connectivity circuitries 731 may include cellular connectivity circuitries, wireless connectivity circuitries, etc. Cellular connectivity circuitries of connectivity circuitries 731 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 731 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 731 may include a network interface, such as a wired or wireless interface, e.g., so that a system embodiment may be incorporated into a wireless device, for example, cell phone or personal digital assistant.

In some embodiments, device 700 comprises control hub 732, which represents hardware devices and/or software components related to interaction with one or more I/O devices. For example, processor 704 may communicate with one or more of display 722, one or more peripheral devices 724, storage devices 728, one or more other external devices 729, etc., via control hub 732. Control hub 732 may be a chipset, a Platform Control Hub (PCH), and/or the like.

For example, control hub 732 illustrates one or more connection points for additional devices that connect to device 700, e.g., through which a user might interact with the system. For example, devices (e.g., devices 729) that can be attached to device 700 include microphone devices, speaker or stereo systems, audio devices, video systems or other display devices, keyboard or keypad devices, or other I/O devices for use with specific applications such as card readers or other devices.

As mentioned above, control hub 732 can interact with audio devices, display 722, etc. For example, input through a microphone or other audio device can provide input or commands for one or more applications or functions of device 700. Additionally, audio output can be provided instead of, or in addition to display output. In another example, if display 722 includes a touch screen, display 722 also acts as an input device, which can be at least partially managed by control hub 732. There can also be additional buttons or switches on computing device 700 to provide I/O functions managed by control hub 732. In one embodiment, control hub 732 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In some embodiments, control hub 732 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 722 represents hardware (e.g., display devices) and software (e.g., drivers) components that provide a visual and/or tactile display for a user to interact with device 700. Display 722 may include a display interface, a display screen, and/or hardware device used to provide a display to a user. In some embodiments, display 722 includes a touch screen (or touch pad) device that provides both output and input to a user. In an example, display 722 may communicate directly with the processor 704. Display 722 can be one or more of an internal display device, as in a mobile electronic device or a laptop device or an external display device attached via a display interface (e.g., DisplayPort, etc.). In one embodiment display 722 can be a head mounted display (HMD) such as a stereoscopic display device for use in virtual reality (VR) applications or augmented reality (AR) applications.

In some embodiments and although not illustrated in the figure, in addition to (or instead of) processor 704, device 700 may include Graphics Processing Unit (GPU) comprising one or more graphics processing cores, which may control one or more aspects of displaying contents on display 722.

Control hub 732 (or platform controller hub) may include hardware interfaces and connectors, as well as software components (e.g., drivers, protocol stacks) to make peripheral connections, e.g., to peripheral devices 724.

It will be understood that device 700 could both be a peripheral device to other computing devices, as well as have peripheral devices connected to it. Device 700 may have a "docking" connector to connect to other computing devices for purposes such as managing (e.g., downloading and/or uploading, changing, synchronizing) content on device 700. Additionally, a docking connector can allow device 700 to connect to certain peripherals that allow computing device 700 to control content output, for example, to audiovisual or other systems.

In addition to a proprietary docking connector or other proprietary connection hardware, device 700 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 731 may be coupled to control hub 732, e.g., in addition to, or instead of, being coupled directly to the processor 704. In some embodiments, display 722 may be coupled to control hub 732, e.g., in addition to, or instead of, being coupled directly to processor 704.

In some embodiments, device 700 comprises memory 730 coupled to processor 704 via memory interface 734. Memory 730 includes memory devices for storing information in device 700. Memory can include nonvolatile (state does not change if power to the memory device is interrupted) and/or volatile (state is indeterminate if power to the memory device is interrupted) memory devices. Memory device 730 can be a dynamic random access memory (DRAM) device, a static random access memory (SRAM) device, flash memory device, phase-change memory device, or some other memory device having suitable performance to serve as process memory. In one embodiment, memory 730 can operate as system memory for device 700, to store data and instructions for use when the one or more processors 704 executes an application or process. Memory 730 can store application data, user data, music, photos, documents, or other data, as well as system data (whether long-term or temporary) related to the execution of the applications and functions of device 700.

Elements of various embodiments and examples are also provided as a machine-readable medium (e.g., memory 730) for storing the computer-executable instructions (e.g., instructions to implement any other processes discussed herein). The machine-readable medium (e.g., memory 730) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 700 comprises temperature measurement circuitries 740, e.g., for measuring temperature of various components of device 700. In an example, temperature measurement circuitries 740 may be embedded, or coupled or attached to various components, whose temperature are to be measured and monitored. For example, temperature measurement circuitries 740 may measure temperature of (or within) one or more of cores 708*a*, 708*b*, 708*c*, voltage regulator 714, memory 730, a mother-board of SOC 701, and/or any appropriate component of device 700.

In some embodiments, device 700 comprises power measurement circuitries 742, e.g., for measuring power consumed by one or more components of the device 700. In an example, in addition to, or instead of, measuring power, the power measurement circuitries 742 may measure voltage and/or current. In an example, the power measurement circuitries 742 may be embedded, or coupled or attached to various components, whose power, voltage, and/or current consumption are to be measured and monitored. For example, power measurement circuitries 742 may measure power, current and/or voltage supplied by one or more voltage regulators 714, power supplied to SOC 701, power supplied to device 700, power consumed by processor 704 (or any other component) of device 700, etc.

In some embodiments, device 700 comprises one or more voltage regulator circuitries, generally referred to as voltage regulator (VR) 714. VR 714 generates signals at appropriate voltage levels, which may be supplied to operate any appropriate components of the device 700. Merely as an example, VR 714 is illustrated to be supplying signals to processor 704 of device 700. In some embodiments, VR 714 receives one or more Voltage Identification (VID) signals, and generates the voltage signal at an appropriate level, based on the VID signals. Various type of VRs may be utilized for the VR 714. For example, VR 714 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 710*a/b* and/or PMIC 712. In some embodiments, each core has a network of distributed LDOs to provide efficient control for power management. The LDOs can be digital, analog, or a combination of digital or analog LDOs.

In some embodiments, device 700 comprises one or more clock generator circuitries, generally referred to as clock generator 716. Clock generator 716 generates clock signals at appropriate frequency levels, which may be supplied to any appropriate components of device 700. Merely as an example, clock generator 716 is illustrated to be supplying clock signals to processor 704 of device 700. In some embodiments, clock generator 716 receives one or more Frequency Identification (FID) signals, and generates the clock signals at an appropriate frequency, based on the FID signals.

In some embodiments, device 700 comprises battery 718 supplying power to various components of device 700. Merely as an example, battery 718 is illustrated to be supplying power to processor 704. Although not illustrated in the FIGURES, device 700 may comprise a charging circuitry, e.g., to recharge the battery, based on Alternating Current (AC) power supply received from an AC adapter.

In some embodiments, device 700 comprises Power Control Unit (PCU) 710 (also referred to as Power Management Unit (PMU), Power Controller, etc.). In an example, some sections of PCU 710 may be implemented by one or more processing cores 708, and these sections of PCU 710 are symbolically illustrated using a dotted box and labelled PCU 710*a*. In an example, some other sections of PCU 710 may be implemented outside the processing cores 708, and these sections of PCU 710 are symbolically illustrated using a dotted box and labelled as PCU 710*b*. PCU 710 may implement various power management operations for device 700. PCU 710 may include hardware interfaces, hardware circuitries, connectors, registers, etc., as well as software components (e.g., drivers, protocol stacks), to implement various power management operations for device 700.

In some embodiments, device 700 comprises Power Management Integrated Circuit (PMIC) 712, e.g., to implement various power management operations for device 700. In some embodiments, PMIC 712 is a Reconfigurable Power Management ICs (RPMICs) and/or an IMVP (Intel® Mobile Voltage Positioning). In an example, the PMIC is within an IC chip separate from processor 704. The may implement various power management operations for device 700. PMIC 712 may include hardware interfaces, hardware circuitries, connectors, registers, etc., as well as software components (e.g., drivers, protocol stacks), to implement various power management operations for device 700.

In an example, device 700 comprises one or both PCU 710 or PMIC 712. In an example, any one of PCU 710 or PMIC 712 may be absent in device 700, and hence, these components are illustrated using dotted lines.

Various power management operations of device 700 may be performed by PCU 710, by PMIC 712, or by a combination of PCU 710 and PMIC 712. For example, PCU 710 and/or PMIC 712 may select a power state (e.g., P-state) for various components of device 700. For example, PCU 710 and/or PMIC 712 may select a power state (e.g., in accordance with the ACPI (Advanced Configuration and Power Interface) specification) for various components of device 700. Merely as an example, PCU 710 and/or PMIC 712 may cause various components of the device 700 to transition to a sleep state, to an active state, to an appropriate C state (e.g., C0 state, or another appropriate C state, in accordance with the ACPI specification), etc. In an example, PCU 710 and/or PMIC 712 may control a voltage output by VR 714 and/or a frequency of a clock signal output by the clock generator, e.g., by outputting the VID signal and/or the FID signal, respectively. In an example, PCU 710 and/or PMIC 712 may control battery power usage, charging of battery 718, and features related to power saving operation.

The clock generator 716 can comprise a phase locked loop (PLL), frequency locked loop (FLL), or any suitable clock source. In some embodiments, each core of processor 704 has its own clock source. As such, each core can operate at a frequency independent of the frequency of operation of the other core. In some embodiments, PCU 710 and/or PMIC 712 performs adaptive or dynamic frequency scaling or adjustment. For example, clock frequency of a processor core can be increased if the core is not operating at its maximum power consumption threshold or limit. In some embodiments, PCU 710 and/or PMIC 712 determines the operating condition of each core of a processor, and opportunistically adjusts frequency and/or power supply voltage of that core without the core clocking source (e.g., PLL of that core) losing lock when the PCU 710 and/or PMIC 712 determines that the core is operating below a target performance level. For example, if a core is drawing current from a power supply rail less than a total current allocated for that core or processor 704, then PCU 710 and/or PMIC 712 can temporarily increase the power draw for that core or processor 704 (e.g., by increasing clock frequency and/or power supply voltage level) so that the core or processor 704 can perform at a higher performance level. As such, voltage and/or frequency can be increased temporality for processor 704 without violating product reliability.

In an example, PCU 710 and/or PMIC 712 may perform power management operations, e.g., based at least in part on receiving measurements from power measurement circuitries 742, temperature measurement circuitries 740, charge level of battery 718, and/or any other appropriate information that may be used for power management. To that end, PMIC 712 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 710 and/or PMIC 712 in at least one embodiment to allow PCU 710 and/or PMIC 712 to manage processor core energy at least in part based on value(s) detected by one or more of the sensors.

Also illustrated is an example software stack of device 700 (although not all elements of the software stack are illustrated). Merely as an example, processors 704 may execute application programs 750, Operating System 752, one or more Power Management (PM) specific application programs (e.g., generically referred to as PM applications 758), and/or the like. PM applications 758 may also be executed by the PCU 710 and/or PMIC 712. OS 752 may also include one or more PM applications 756a, 756b, 756c. The OS 752 may also include various drivers 754a, 754b, 754c, etc., some of which may be specific for power management purposes. In some embodiments, device 700 may further comprise a Basic Input/Output System (BIOS) 720. BIOS 720 may communicate with OS 752 (e.g., via one or more drivers 754), communicate with processors 704, etc.

For example, one or more of PM applications 758, 756, drivers 754, BIOS 720, etc. may be used to implement power management specific tasks, e.g., to control voltage and/or frequency of various components of device 700, to control wake-up state, sleep state, and/or any other appropriate power state of various components of device 700, control battery power usage, charging of the battery 718, features related to power saving operation, etc.

In various embodiments, clock generator 716 (and/or other suitable circuit resources of device 700) includes or otherwise operates based on circuitry to determine—and in some embodiments, mitigate—a skew between two clock signals. In one such embodiment, said circuitry provides some or all of the functionality of detector circuitry 150, detector circuitry 400, detector circuitry 500, or detector circuitry 600 (for example). Different embodiments variously evaluate a skew which, for example, is between clock signals in a same clock domain—e.g., where such clock signals each have the same frequency. Based on such skew evaluation, various embodiments facilitate a synchronization of accesses to respective registers in a given processor core, of accesses to respective registers in different cores, of accesses to respective registers in a core and a cache, of respective registers in a cache and IO circuitry, and/or the like.

Techniques and architectures for determining a clock skew are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   first circuitry to generate a signal S1 which indicates a logical NAND combination of a clock signal clk1 and a clock signal clk2;
   second circuitry to generate a signal S2 which indicates a logical NOR combination of the clock signals clk1 and clk2;
   third circuitry coupled to the first circuitry and the second circuitry, the third circuitry to:
      evaluate a duration Ts1 of a period of time that the signal S1 indicates a first logic state;
      evaluate a duration Ts2 of a period of time that the signal S2 indicates a second logic state; and
      generate a signal S3, based on the duration Ts1 and the duration Ts2, which indicates a skew between the clock signals clk1 and clk2.

2. The device of claim 1, wherein the signal S3 is generated based on a difference between the duration Ts1 and the duration Ts2.

3. The device of claim 1, the third circuitry further to:
   evaluate a duration Tc1 of a period of time that the clock signal clk1 indicates a first one of a high output state or a low output state; and
   evaluate a duration Tc2 of a period of time that the clock signal clk2 indicates the first one of the high output state or the low output state;
   wherein the third circuitry is to generate the signal S3 further based on the duration Tc1 and the duration Tc2.

4. The device of claim 1, wherein the third circuitry is to evaluate one of the duration Ts1 or the duration Ts2 based on each of multiple cycles of one of the signal S1 or the signal S2.

5. The device of claim 1, wherein the third circuitry is to evaluate the duration Ts1 in parallel with an evaluation of the duration Ts2.

6. The device of claim 1, further comprising fourth circuitry coupled between the third circuitry and each of the first circuitry and the second circuitry, the fourth circuitry to multiplex between:
   a communication of one of the clock signal clk1, the clock signal clk2, the signal S1, or the signal S2; and
   a communication of another of the clock signal clk1, the clock signal clk2, the signal S1, or the signal S2.

7. The device of claim 6, wherein the fourth circuitry is to multiplex between a communication of the signal S1 and a communication of the signal S2.

8. The device of claim 1, wherein the clock signals clk1 and clk2 are each based on a clock signal clk0.

9. The device of claim 1, further comprising:
   fourth circuitry to apply a delay to one of the clock signal clk1 or the clock signal clk2 based on the signal S3.

10. The device of claim 9, further comprising:
    fifth circuitry to generate a signal S4 which identifies a leading one of the clock signal clk1 or the clock signal clk2, wherein the fourth circuitry is to apply the delay further based on the signal S4.

11. The device of claim 1, wherein a frequency of the clock signal clk1 is equal to a frequency of the clock signal clk2.

12. A system comprising:
    an integrated circuit comprising:
       first circuitry to generate a signal S1 which indicates a logical NAND combination of a clock signal clk1 and a clock signal clk2;
       second circuitry to generate a signal S2 which indicates a logical NOR combination of the clock signals clk1 and clk2;
       third circuitry coupled to the first circuitry and the second circuitry, the third circuitry to:
          evaluate a duration Ts1 of a period of time that the signal S1 indicates a first logic state;
          evaluate a duration Ts2 of a period of time that the signal S2 indicates a second logic state; and
          generate a signal S3, based on the duration Ts1 and the duration Ts2, which indicates a skew between the clock signals clk1 and clk2; and
    a display device coupled to the integrated circuit, the display device to display an image based on one of the clock signals clk1 and clk2.

13. The system of claim 12, wherein the signal S3 is generated based on a difference between the duration Ts1 and the duration Ts2.

14. The system of claim 12, the third circuitry further to:
    evaluate a duration Tc1 of a period of time that the clock signal clk1 indicates a first one of a high output state or a low output state; and
    evaluate a duration Tc2 of a period of time that the clock signal clk2 indicates the first one of the high output state or the low output state;
    wherein the third circuitry is to generate the signal S3 further based on the duration Tc1 and the duration Tc2.

15. The system of claim 12, wherein the third circuitry is to evaluate one of the duration Ts1 or the duration Ts2 based on each of multiple cycles of one of the signal S1 or the signal S2.

16. The system of claim 12, the integrated circuit further comprising:
    fourth circuitry to apply a delay to one of the clock signal clk1 or the clock signal clk2 based on the signal S3.

17. A device comprising:
first circuitry to:
- receive each of a signal S1 which indicates a logical NAND combination of a clock signal clk1 and a clock signal clk2, and a signal S2 which indicates a logical NOR combination of the clock signals clk1 and clk2;
- determine each of a length of time Ts1 that the signal S1 indicates a first logic state, a length of time Ts2 that the signal S2 indicates a second logic state, a length of time Tc1 that the clock signal clk1 indicates a first one of a high output state or a low output state, and a length of time Tc2 that the clock signal clk1 indicates the first one of the high output state or the low output state;

second circuitry coupled to the first circuitry, the second circuitry to perform an evaluation of a skew between the clock signals clk1 and clk2, including the second circuitry calculate a sum of a first difference between the lengths of time Ts1 and Ts2, and a second difference between the lengths of time Tc1 and Tc2; and wherein, based on the evaluation, the second circuitry is further to generate a control signal to apply a delay to one of the clock signals clk1 and clk2.

18. The device of claim 17, further comprising a combinatorial logic gate to generate one of the signal S1 or the signal S2, wherein:
- the combinatorial logic gate comprises a first transistor;
- the first transistor and a second transistor of the device comprise a first channel and a second channel, respectively; and
- a first length of the first channel is at least 50% greater than a second length of the second channel.

19. The device of claim 17, wherein the first circuitry is to evaluate one of the length of time Ts1 or the length of time Ts2 based on each of multiple cycles of one of the signal S1 or the signal S2.

20. The device of claim 17, wherein the first circuitry is to evaluate the length of time Ts1 in parallel with an evaluation of the length of time Ts2.

* * * * *